United States Patent
Sato

(10) Patent No.: US 10,255,972 B1
(45) Date of Patent: Apr. 9, 2019

(54) MEMORY SYSTEM AND CONTROL METHOD OF MEMORY SYSTEM

(71) Applicant: TOSHIBA MEMORY CORPORATION, Tokyo (JP)

(72) Inventor: Nobuaki Sato, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/908,828

(22) Filed: Mar. 1, 2018

(30) Foreign Application Priority Data

Sep. 15, 2017 (JP) ................................. 2017-178094

(51) Int. Cl.
G11C 16/04 (2006.01)
G11C 11/56 (2006.01)
G11C 16/26 (2006.01)

(52) U.S. Cl.
CPC .......... *G11C 11/5642* (2013.01); *G11C 16/26* (2013.01); *G11C 16/0483* (2013.01)

(58) Field of Classification Search
CPC ................. G11C 5/02; G11C 11/5628; G11C 2211/5621; G11C 2211/5622; G11C 2211/5643; G11C 2216/14
USPC .......... 365/185.08, 185.18, 185.19, 185.22, 365/185.28, 185.33, 189.05
See application file for complete search history.

(56) References Cited

U.S. PATENT DOCUMENTS

| | | | |
|---|---|---|---|
| 9,007,854 B1 * | 4/2015 | Nemati Anaraki | G06F 11/10 365/189.09 |
| 9,236,099 B2 | 1/2016 | Alhussien et al. | |
| 9,437,315 B2 | 9/2016 | Lee | |
| 2013/0148436 A1 | 6/2013 | Kurosawa | |

FOREIGN PATENT DOCUMENTS

JP 2013-122804 A 6/2013

\* cited by examiner

*Primary Examiner* — Thong Q Le
(74) *Attorney, Agent, or Firm* — Kim & Stewart LLP

(57) ABSTRACT

A memory system includes a non-volatile memory and a controller configured to perform a read re-try in response to a failed normal read. The read re-try includes a first read of data at a first read voltage, a second read of data at a second read voltage obtained by shifting the first read voltage by a first shift amount, which is determined according to a bit count value obtained by counting a number of predetermined bit values in the first read, a third read of data carried out a plurality of times at a plurality of third read voltages, wherein each of the plurality of third read voltages are shifted from each other by a second shift amount, and a final read of data at a read voltage that is set closer to the second read voltage than the first read voltage.

20 Claims, 10 Drawing Sheets

| Set No | Er-A VALLEY | A-B VALLEY | B-C VALLEY | C-D VALLEY | D-E VALLEY | E-F VALLEY | F-G VALLEY |
|---|---|---|---|---|---|---|---|
| 0 | V7 | V6 | V5 | V4 | V3 | V2 | V1 |
| ⋮ | ⋮ | ⋮ | ⋮ | ⋮ | ⋮ | ⋮ | ⋮ |
| k | V9 | V8 | V7 | V6 | V5 | V4 | V3 |
| ⋮ | ⋮ | ⋮ | ⋮ | ⋮ | ⋮ | ⋮ | ⋮ |

| Er-A VALLEY | A-B VALLEY | B-C VALLEY | C-D VALLEY | D-E VALLEY | E-F VALLEY | F-G VALLEY | SHIFT AMOUNT [V] |
|---|---|---|---|---|---|---|---|
| 0~499 | 2000~2499 | 4000~4499 | 6000~6499 | 8000~8499 | 10000~10499 | 12000~12499 | 1 |
| 500~999 | 2500~2999 | 4500~4999 | 6500~6999 | 8500~8999 | 10500~10999 | 12500~12999 | 0.75 |
| 1000~1999 | 3000~3999 | 5000~5999 | 7000~7999 | 9000~9999 | 11000~11999 | 13000~13999 | 0.5 |
| 2000~2999 | 4000~4999 | 6000~6999 | 8000~8999 | 10000~10999 | 12000~12999 | 14000~14999 | 0.25 |
| 3000~3499 | 5000~5499 | 7000~7499 | 9000~9499 | 11000~11499 | 13000~13499 | 15000~15499 | 0 |
| 3500~3999 | 5500~5999 | 7500~7999 | 9500~9999 | 11500~11999 | 13500~13999 | 15500~15999 | -0.25 |
| 4000~4499 | 6000~6499 | 8000~8499 | 10000~10499 | 12000~12499 | 14000~14499 | 16000~16499 | -0.5 |
| 4500~4999 | 6500~6999 | 8500~8999 | 10500~10999 | 12500~12999 | 14500~14999 | 16500~16999 | -0.75 |
| 5000~ | 7000~ | 9000~ | 11000~ | 13000~ | 15000~ | 17000~ | -1 |

221

US 10,255,972 B1

MEMORY SYSTEM AND CONTROL METHOD OF MEMORY SYSTEM

CROSS-REFERENCE TO RELATED APPLICATION

This application is based upon and claims the benefit of priority from. Japanese Patent Application No. 2017-178094, filed Sep. 15, 2017, the entire contents of which are incorporated herein by reference.

FIELD

Embodiments described herein relate generally to a memory system and a control method of the memory system.

BACKGROUND

In a memory system including a non-volatile memory having a plurality of memory cells, an operation of reading data from each memory cell is performed by applying a read voltage between a substrate and a control gate.

DESCRIPTION OF THE DRAWINGS

FIG. 7 is a table used for determining a global shift amount of the threshold voltage distributions in the embodiment.

DETAILED DESCRIPTION

Figure 1:
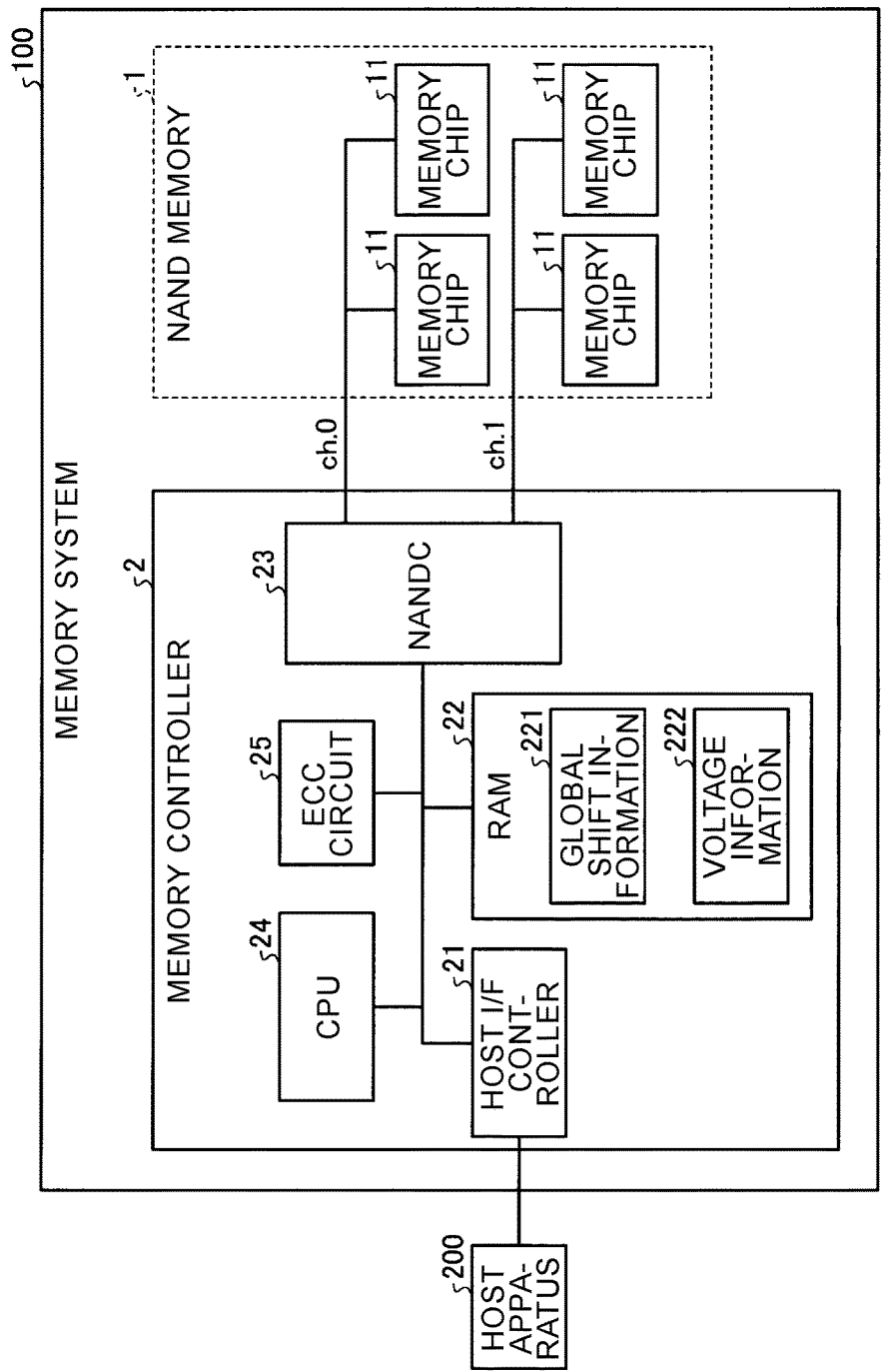
FIG. 1 is a view illustrating a configuration of a memory system according to an embodiment.

Embodiments provide a memory system and a control method of the memory system in which data may be properly read from each memory cell.

In general, according to one embodiment, there is provided a memory system including a non-volatile memory including a plurality of memory cells and a controller. The controller is configured to perform a read re-try in response to a failed normal read. The read re-try includes a first read processing of reading data from the plurality of memory cells at a first read voltage, a second read processing of reading data from the plurality of memory cells at a second read voltage obtained by shifting the first read voltage by a first shift amount, which is determined according to a bit count value obtained by counting a number of predetermined bit values in the data read in the first read processing, a third read processing of reading data from the plurality of memory cells a plurality of times at a plurality of third read voltages and obtaining a bit count value for each of the third read voltages, wherein each of the plurality of third read voltages are shifted from each other by a second shift amount, and a final read processing of reading data from the plurality of memory cells at a read voltage that is set closer to the second read voltage than the first read voltage.

Hereinafter, a memory system according to an embodiment will be described in detail with reference to the accompanying drawings. Meanwhile, the present disclosure is not limited by the embodiment described herein.

Embodiment

A memory system according to an embodiment will be described. In a memory system including a non-volatile memory having a plurality of memory cells, an operation of reading data from each memory cell is performed by applying a read voltage between a substrate and a control gate. When a read voltage is set as a voltage in a valley portion between peaks of the number of memory cells in a memory cell threshold voltage distribution, it is possible to reduce the number of occurrences of a bit error in a read bit value. The threshold voltage distribution of memory cells is a distribution that indicates the number of memory cells in the memory cell array that have the threshold voltage of the distribution.

Meanwhile, in order to increase the storage capacity of the memory system, it is required to shift from a multi-level cell (MLC) in which 2-bit information are stored in each memory cell to a triple-level cell (TLC) in which 3-bit information are stored in each memory cell. In the triple-level cell (TLC), since a distance between peaks tends to be smaller in the memory cell threshold voltage distribution, a higher accuracy than in the multi-level cell (MLC) is required in the required accuracy of a read voltage.

In order to increase the accuracy of a read voltage, in the memory system, a Vth (threshold voltage) tracking may be performed to search for a position of a valley in the memory cell threshold voltage distribution. In the Vth tracking, a shift read operation is performed. In the shift read operation, the read voltage is continually shifted by a predetermined step width prior to reading, and then the position of the valley is searched for in the memory cell threshold voltage distribution based on the read results. Accordingly, when a proper read voltage may be specified according to the read results, it is possible to read data from memory cells at the proper read voltage while reducing the number of occurrences of a bit error in the read data.

However, in the memory cell threshold voltage distribution, a voltage position (an absolute position with respect to a reference (e.g., 0 V) in the horizontal direction on a virtual plane in which the horizontal axis indicates a threshold voltage and the vertical axis indicates the number of memory cells) may be changed over time. For example, when each memory cell becomes deteriorated through repetition of a programming/erasing cycle (a P/E cycle), the voltage position may deviate in the memory cell threshold voltage distribution due to the deterioration. Otherwise, for example, when an environmental temperature at the time of programming in each memory cell is different from an environmental temperature at the time of reading, the voltage position may deviate in the memory cell threshold voltage distribution due to the influence of a difference between the environmental temperatures. In a case where a deviation of the voltage position is large in the memory cell threshold voltage distribution (e.g., when the voltage position largely deviates by about one peak or half of one peak), even when the Vth tracking is performed, the position of the valley may not be tracked (i.e., found), and a position of another valley (e.g., an adjacent wrong valley) than the valley of the original reading target may be tracked. This may lead to an erroneous detection.

Therefore, in the present embodiment, in the memory system, it is detected whether or not the memory cell threshold voltage distribution deviates by a large amount, and a Vth tracking is performed according to the detection result, so as to reduce an erroneous detection in the Vth tracking.

Specifically, a memory system 100 is configured as illustrated in FIG. 1. FIG. 1 is a view illustrating a configuration of the memory system 100.

The memory system 100 is connected to a host apparatus 200. The host apparatus 200 corresponds to, for example, a server, a personal computer, or a mobile-type information processing apparatus, etc. The memory system 100 functions as an external storage device of the host apparatus 200. The host apparatus 200 may issue an access request (e.g., a read request or a write request) to the memory system 100. The standard to which a communication interface interconnecting the memory system 100 and the host apparatus 200 conforms is not limited to a specific standard. For example, the communication interface conforms to an advanced technology attachment (ATA) standard, a serial attached SCSI (SAS) standard, a peripheral components interconnect (PCI) express (PCIe®) standard or the like.

The memory system 100 includes an NAND-type flash memory (hereinafter referred to as "NAND memory") 1, and a memory controller 2 that executes a data transmission between the host apparatus 200 and the NAND memory 1. The memory system 100 may include other types of memory instead of the NAND memory 1. For example, the memory system 100 may include a NOR-type flash memory instead of the NAND memory 1.

The NAND memory 1 includes a plurality of memory chips 11 (here, four memory chips 11) as a semiconductor memory. The memory controller 2 includes two channels (ch.0, and ch.1). The memory controller 2 may include one channel or three or more channels. Two memory chips 11 are connected to each channel. Each channel includes a control signal line, an I/O signal line, a chip enable (CE) signal line, and a ready (RY)/busy (BY) signal line. The I/O signal line is a signal line that transmits data, addresses, and various instructions. The memory controller 2 may transmit a read instruction, a programming instruction, and an erasing instruction to the memory chip 11 through the I/O signal line. The control signal line includes a write enable (WE) signal line, a read enable (RE) signal line, a command latch enable (CLE) signal line, an address latch enable (ALE) signal line, a write protect (WP) signal line, or the like. The RY/BY signal line indicates whether the NAND memory 1 is operating, through the level thereof. For example, the RY/BY signal line indicates a ready state (RY) corresponding to a non-operating state through an H level, and indicates a busy state (BY) corresponding to an operating state through an L level.

Figure 2:
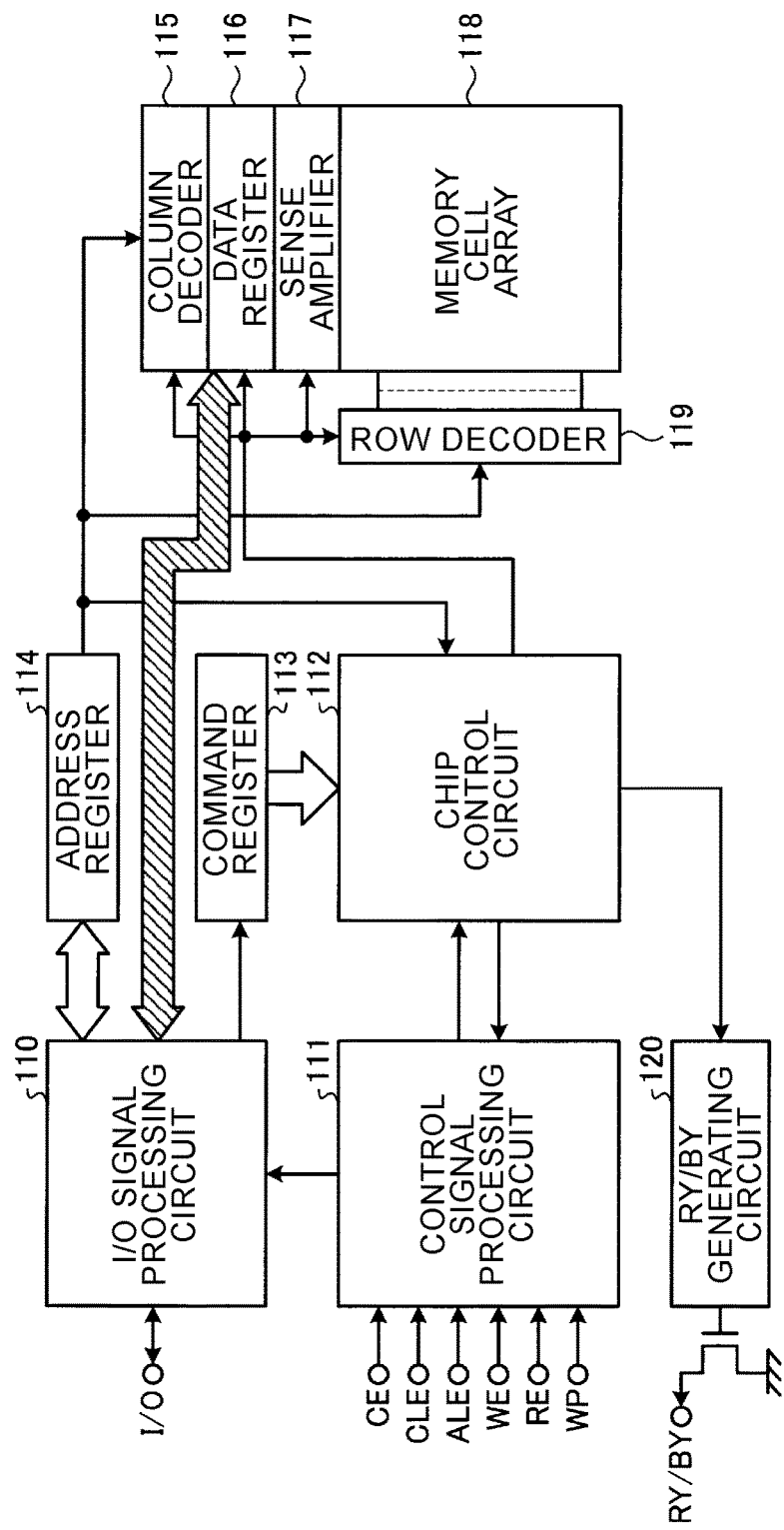
FIG. 2 is a view illustrating a configuration of a memory chip in the embodiment.

For example, each memory chip 11 is configured as illustrated in FIG. 2. FIG. 2 is a view illustrating a configuration of the memory chip 11.

The memory chip 11 includes an I/O signal processing circuit 110, a control signal processing circuit 111, a chip control circuit 112, a command register 113, an address register 114, a column decoder 115, a data register 116, a sense amplifier 117, a memory cell array 118, a row decoder 119, and an RY/BY generating circuit 120.

The chip control circuit 112 is a circuit that switches a state based on various control signals received through the control signal processing circuit 111. The chip control circuit 112 controls the entire operation of the memory chip 11. The RY/BY generating circuit 120 switches the state of the RY/BY signal line between a ready state (RY) and a busy state (BY) under the control by the chip control circuit 112.

The I/O signal processing circuit 110 is a buffer circuit that transmits and receives I/O signals to/from the memory controller 2. A command latched by the I/O signal processing circuit 110, an address designating an access destination, and data are allocated to and stored in the command register 113, the address register 114, and the data register 116, respectively.

The address stored in the address register 114 includes a chip number, a row address, and a column address. The chip number is identification information that identifies each memory chip 11. The chip number, the row address, and the column address are read by the chip control circuit 112, the row decoder 119, and the column decoder 115, respectively.

The control signal processing circuit 111 accepts the input of a control signal. The control signal processing circuit 111 executes allocation of a register of a storage destination of the I/O signal accepted by the I/O signal processing circuit 110, based on the accepted control signal. The control signal processing circuit 111 transmits the accepted control signal to the chip control circuit 112.

The memory cell array 118 includes a plurality of blocks. A block is a storage area corresponding to a physical execution unit of erasing. That is, all data pieces stored in one block are erased at once.

Figure 3:
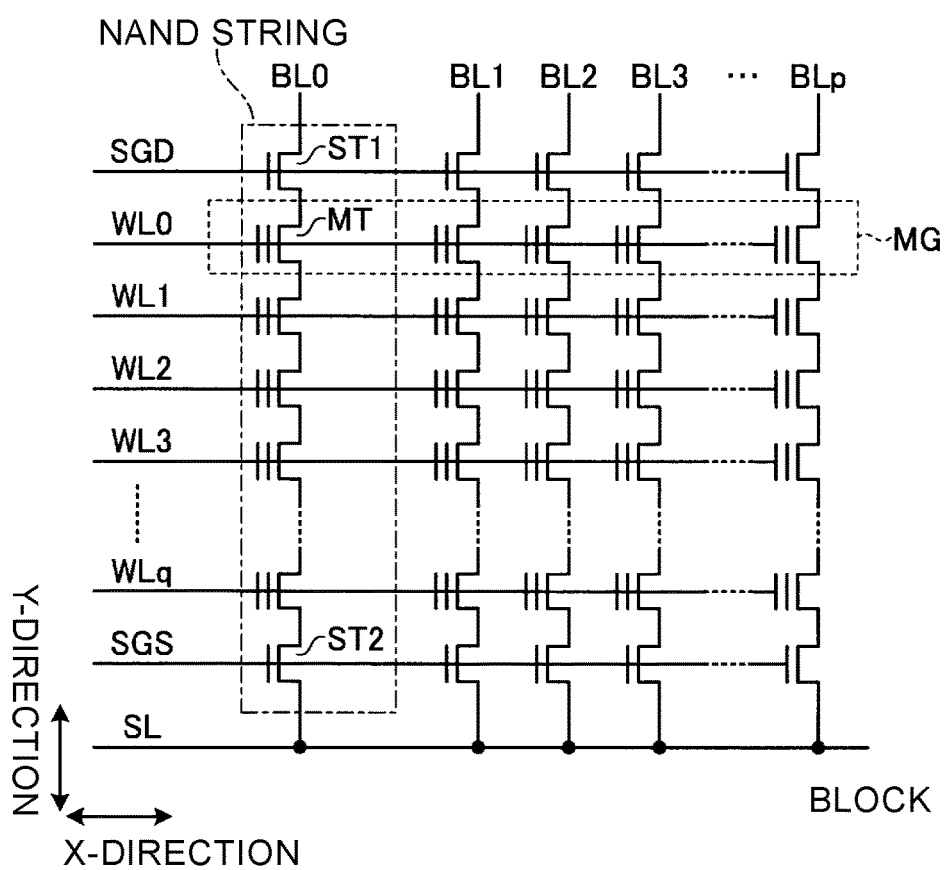
FIG. 3 is a view illustrating a configuration of a block in the embodiment.

For example, each block in the memory cell array 118 is configured as illustrated in FIG. 3. FIG. 3 is a view illustrating the configuration of the block.

Each block includes (p+1) NAND strings arranged along the X direction (p≥0). Select transistors ST1 are provided in the (p+1) NAND strings, respectively, and include drains connected to bit lines BL0 to BLp, respectively, and gates connected to a select gate line SGD in common. Select transistors ST2 are also provided in the (p+1) NAND strings, respectively, and include sources connected to a source line SL in common, and gates connected to a select gate line SGS in common.

Each memory cell transistor MT is composed of a metal oxide semiconductor field effect transistor (MOSFET) having a stacked gate structure formed on a semiconductor substrate. The stacked gate structure includes a floating gate formed on the semiconductor substrate through a tunnel oxide film, and a control gate electrode formed on the floating gate through an inter-gate insulating film. A threshold voltage of the memory cell transistor MT changes according to the number of electrons accumulated in the floating gate. The memory cell transistor MT stores data according to a difference in its threshold voltage. That is, the memory cell transistor MT holds charges in the floating gate in the amount according to the data it has been designated to store.

In each NAND string, (q+1) memory cell transistors MT are arranged such that respective current paths are connected in series between the source of the select transistor ST1 and the drain of the select transistor ST2 (q≥0). Then, in order from the memory cell transistor MT located closest to the drain side, control gate electrodes are connected to word lines WL0 to WLq, respectively. Therefore, the drain of the memory cell transistor MT connected to the word line WL0 is connected to the source of the select transistor ST1, and the source of the memory cell transistor MT connected to the word line WLq is connected to the drain of the select transistor ST2.

Each of the word lines WL0 to WLq is connected in common to control gate electrodes of one of the memory cell transistors MT across all of the NAND strings within the block. That is, the control gate electrodes of the memory cell transistors MT that are present in the same row within the block, are connected to the same word line WL. That is, the block includes a plurality of memory cell groups MG, each corresponding to one of the word lines WL, and each memory cell group MG includes the (p+1) memory cell transistors MT connected to the same word line WL. In a configuration where each memory cell transistor MT may hold a value represented by 1 bit (an operation is made in a single level cell (SLC) mode), the (p+1) memory cell transistors MT (i.e., the memory cell group MG) connected to the same word line WL store one page of data, and the programming of data and the reading of data are performed per page.

In a configuration where each memory cell transistor MT may hold a value of a plurality of bits, for example, when each memory cell transistor MT is capable of storing a value represented by n bits (n≥2), the storage capacity per word line WL is equal to n pages. That is, each memory cell group MG stores n pages of data. Here, descriptions will be made on, as an example, a case where each memory cell transistor MT operates in a triple-level cell (TLC) mode in which a value represented by 3 bits is stored. In the triple-level cell (TLC) mode, data of three pages are held in memory cell transistors MT connected to each word line WL. Among these three pages, a page for which writing is made first is referred to as a lower page, a page for which writing is made after the lower page is referred to as a middle page, and a page for which writing is made after the middle page is referred to as an upper page. Hereafter, the memory cell transistor MT is simply referred to as a memory cell. It should be understood that there may be a mode in which programs are collectively executed for a plurality of pages or all pages corresponding to one word line WL.

Figure 4:
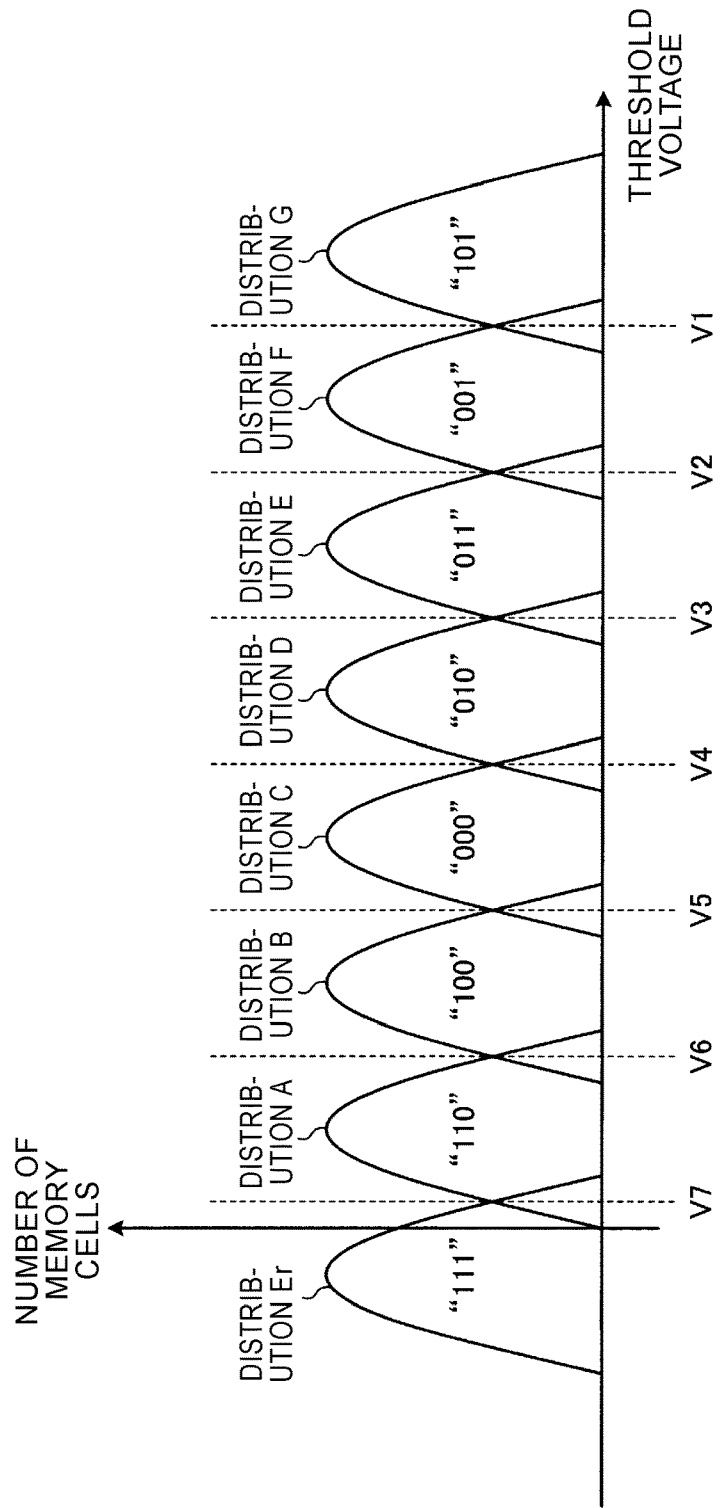
FIG. 4 is a view illustrating a threshold voltage distribution of memory cells in the embodiment.

When each memory cell operates in a triple-level cell (TLC) mode, for example, a threshold voltage distribution of memory cells is as illustrated in FIG. 4. FIG. 4 is a view illustrating a threshold voltage distribution of memory cells. In FIG. 4, the horizontal axis indicates a threshold voltage, and the vertical axis indicates the number of memory cells.

According to the triple-level cell (TLC) mode, each memory cell may hold eight-valued data "xyz" defined by data "x" belonging to the upper page, data "y" belonging to the middle page, and data "z" belonging to the lower page. A value of each of data "x," data "y," and data "z" is either a bit value "0" or a bit value "1." The threshold voltage of each memory cell is controlled to belong to anyone of eight groups, that is, a distribution Er, a distribution A, a distribution B, a distribution C, a distribution D, a distribution E, a distribution F, and a distribution G. The correspondence between each distribution and the data value of eight-valued data "xyz" is set in advance. For example, a data value "111" is allocated to the distribution Er. A data value "110" is allocated to the distribution A. A data value "100" is allocated to the distribution B. A data value "000" is allocated to the distribution C. A data value "010" is allocated to the distribution D. A data value "011" is allocated to the distribution E. A data value "001" is allocated to the distribution F. A data value "101" is allocated to the distribution G. However, the correspondence between each distribution and the data value is not limited to the above.

Referring back to FIG. 2, the row decoder 119, the column decoder 115, the data register 116, and the sense amplifier 117 constitute a peripheral circuit for the memory cell array 118. The peripheral circuit executes an access (reading, programming, and erasing) to the memory cell array 118, based on the control by the chip control circuit 112.

For example, at the time of programming, the column decoder 115 selects and activates a bit line corresponding to a column address. The sense amplifier 117 sets a potential of the bit line selected by the column decoder 115, to 0 volt. The row decoder 119 applies a programming pulse to a word line WL corresponding to a row address. Then, electrons are injected into a floating gate of a memory cell located at an intersection between the selected bit line and the selected word line WL, and as a result, a threshold voltage of the floating gate rises. Each time the programming pulse is applied, the sense amplifier 117 checks whether the threshold voltage reaches a voltage according to data stored in the data register 116. The sense amplifier 117 allows the row decoder 119 to continue to apply the programming pulse until the threshold voltage reaches the voltage according to data.

At the time of reading, the sense amplifier 117 precharges a power supply potential Vcc to the bit line BL, and the row decoder 119 sequentially applies a plurality of types of determination potentials (also known as "read voltages") to the selected word line WL by which a distribution of each data value ("111," "110," "100," "000," "010," "011," "001," and "101") may be specified. The row decoder 119 applies a transmission potential to an unselected word line WL so that memory cells belonging to the unselected word line WL are placed in a conductive state. The sense amplifier 117 detects whether or not charges accumulated by precharging flows to a source line SL by application of one of the read voltages, thereby determining a data value stored in a target memory cell.

Figure 5:
FIG. 5 is a table used for determining a read voltage in the embodiment.

For example, as illustrated in FIG. 4, a read voltage V7 is set between the distribution Er and the distribution A. A read voltage V6 is set between the distribution A and the distribution B. A read voltage V5 is set between the distribution B and the distribution C. A read voltage V4 is set between the distribution C and the distribution D. A read voltage V3 is set between the distribution D and the distribution E. A read voltage V2 is set between the distribution E and the distribution F. A read voltage V1 is set between the distribution F and the distribution G. For example, as illustrated in FIG. 5, these read voltages may correspond to a set of read voltages of a default set number "0."

Further, for each distribution pattern that may be changeable over time, a set of read voltages may be prepared. Each set of read voltages may be stored in advance in a management information storage area of the NAND memory 1, as a table of voltage information 222 used for determining read voltages, as illustrated in FIG. 5. FIG. 5 is a view illustrating an example of the configuration of the voltage information 222. Here, the table illustrated in FIG. 5 is an example of an implementation form of the voltage information 222, and the voltage information 222 may be implemented in another form (e.g., a function formula, etc.). For example, at the time of activation of the memory system 100, the memory controller 2 may read the voltage information 222 from the management information storage area of the NAND memory 1, and store the voltage information 222 in a RAM 22.

The sense amplifier 117 stores read data in the data register 116. The data stored in the data register 116 is sent to the I/O signal processing circuit 110 through a data line, and is transmitted from the I/O signal processing circuit 110 to the memory controller 2.

As a reference value of each of read voltages V1 to V7 in the default set number "0," a common value may be set for the plurality of memory chips 11, or different reference values may be set for the memory chips 11. As a reference value of each of read voltages V1 to V7, a common value may be set for blocks or a unit other than blocks. A method of setting a reference value is not limited to a specific method. The memory controller 2 may set the reference value of each of read voltages by sending a predetermined command to a target memory chip 11.

Referring back to FIG. 1, the memory controller 2 includes a host interface controller (host I/F controller) 21, the random access memory (RAM) 22, a NAND controller (NANDC) 23, a central processing unit (CPU) 24, and an ECC circuit 25. The host I/F controller 21, the RAM 22, the NAND controller 23, the CPU 24, and the ECC circuit 25 are connected to each other via a bus. The memory controller 2 may be one circuit (IC) in which the host I/F controller 21, the RAM 22, the NAND controller 23, the CPU 24, and the ECC circuit 25 are integrated. A part of the host I/F controller 21, the RAM 22, the NAND controller 23, the CPU 24, and the ECC circuit 25 may be disposed outside the memory controller 2.

The RAM 22 functions as a buffer that stores data transmitted between the host apparatus 200 and the NAND memory 1. The RAM 22 provides a working area to the CPU 24. The RAM stores various management information including, for example, global shift information 221 and the voltage information 222.

The type of the RAM 22 is not limited to a specific type. As a type of the RAM 22, for example, a dynamic random access memory (DRAM) or a static random access memory (SRAM) may be employed.

The host I/F controller 21, under the control of the CPU 24, executes a control of a communication interface between the host apparatus 200 and the memory system. 100, and a control of data transmission between the host apparatus 200 and the RAM 22.

The NAND controller 23 controls the respective channels (ch.0, and ch.1). The NAND controller 23 executes a control of data transmission between the NAND memory 1 and the RAM 22, under the control of the CPU 24.

The ECC circuit 25 performs encoding for an error correction, on data to be programmed into the NAND memory 1, or executes an error correction on data read from the NAND memory 1.

The memory controller 2 may read data by changing a set value of a read voltage. There is a case where by changing a set value of a read voltage, the number of error bits may be reduced at the time of data reading. Hereinafter, the reading by changing the set value of the read voltage will be referred to as shift read.

In an example, the memory controller 2 corrects, by the ECC circuit 25, a value among read data, that had changed from a value at the time of programming and thus become error bits, thereby restoring data at the time of the programming. The memory controller 2 may fail to perform an error correction by the ECC circuit 25. The failure in the error correction indicates that it is impossible to restore the data at the time of the programming, from the read data. Specifically, the failure in the error correction indicates that it is impossible to correct error bits included in the read data. The success in the error correction indicates that all error bits included in the read data are corrected.

Figures 6A, 6B, 6C, 6D:
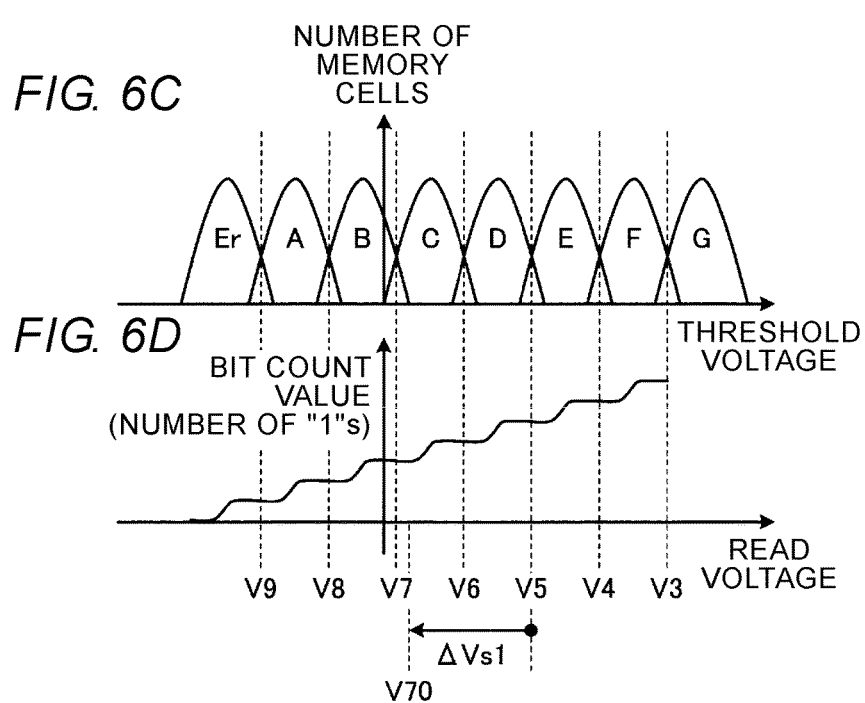
FIGS. 6A to 6D are views illustrating an overall deviation in the threshold voltage distribution of memory cells in the embodiment.

When the error correction by the ECC circuit 25 has failed, the memory controller 2 in one embodiment issues a read re-try request as a programmatic response thereto. In another embodiment, the memory controller 2 notifies the host apparatus 200 that the error correction has failed. Accordingly, the host apparatus 200 sends the read re-try request to the memory system 100. The memory controller 2 receives the read re-try request from the host apparatus 200. The memory controller 2 may perform the Vth tracking as illustrated in FIGS. 6A and 6B, according to the read re-try request as the programmatic response or in response to the read re-try request from the host apparatus 200. FIG. 6A illustrates an example of a distribution of memory cells.

According to the Vth tracking, when foots of distributions overlap each other among distributions having different corresponding data values, the sum of the numbers of memory cells belonging to the plurality of overlapping distributions may be obtained at a read voltage in the range where the foots of the distributions overlap each other.

In the Vth tracking, shift read is executed in a binary mode (SLC mode) while changing the set value of the read voltage, and the number of "1"s or "0"s included in the data obtained through each shift read is counted. The binary mode is a mode in which it is determined that a memory cell having a threshold voltage smaller than a read voltage stores a first data value, and a memory cell having a threshold voltage larger than a read voltage stores a second data value other than the first data value. Here, as an example, it is assumed that "1" is a first data value, "0" is a second data value, and the number of "1"s is counted. When the number of counted "1"s is plotted with respect to the read voltage, a curve illustrated in FIG. 6B may be obtained. In the present embodiment, the number of counted "1"s will be referred to as a bit count value.

Subsequently, a change rate of the bit count value is calculated. The change rate of the bit count value is a change amount of the number of "1"s in the case where a read voltage is changed by a predetermined unit amount. In order to grasp the change amount, the memory controller 2 performs, for example, four read operations, and acquires bit count values of the respective four points while changing a read voltage by a predetermined step width, and then takes differences between the bit count values of the four points. When the change rate obtained in this manner is plotted with respect to the read voltage, it is possible to obtain an approximation of the distribution of memory cells (i.e., a part of a curve indicated by the solid line in FIG. 6A (e.g., a valley portion between the distribution B and the distribution C)) with respect to the threshold voltage.

However, the threshold voltage distribution of the memory cells may be changed from the distribution illustrated in FIG. 6A to the distribution illustrated in FIG. 6C, over time. In the example of FIGS. 6A to 6D, read voltages V1 to V7 for respective valleys, as a whole, are shifted to read voltage V3 to V9, respectively. For example, assuming the distribution illustrated in FIG. 6A, when a valley between the distribution B and the distribution C is searched for by shifting the read voltage around V5, in the case of the distribution illustrated in FIG. 6C, a valley between distribution D and the distribution E is searched for in actuality.

In the present embodiment, the overall deviation of the threshold voltage distribution of the memory cells will be referred to as global shift in the sense that the threshold voltage distribution of the memory cells is globally shifted.

In order to correct the influence of the global shift, it is required to know a global shift amount that indicates the degree of the global shift.

As can be seen from the comparison between the set of FIGS. 6A and 6B and the set of FIGS. 6C and 6D, there is a one-to-one correspondence between the threshold voltage distribution of the memory cells and the graph of a change of the bit count value. Therefore, as illustrated in FIG. 6D, the global shift amount may be specified from the bit count value for the read voltage. In FIG. 6D, a case where the global shift amount is specified as $\Delta Vs1$ (<0), and the read voltage is shifted to V70=V5+$\Delta Vs1$ is exemplified.

Such a global shift amount is experimentally acquired, in advance, for each valley as a searching target, the global shift amount is configured as a table illustrated in FIG. 7, and stored in the management information storage area of the NAND memory 1. FIG. 7 is a view illustrating a table of the global shift information 221 used for determining a global shift amount. Here, values in the table illustrated in FIG. 7 are exemplary only, but do not limit the global shift amount. The table illustrated in FIG. 7 is an example of an implementation form of the global shift information 221, and the global shift information 221 may be configured as another implementation form (e.g., a function formula, etc.). For example, at the time of activation of the memory system 100, the memory controller 2 may read the global shift information 221 from the management information storage area of the NAND memory 1 and store the global shift information 221 in the RAM 22.

By referring to the global shift information 221 illustrated in FIG. 7, it is possible to specify a global shift amount according to a bit count value, for each valley as a searching target. For example, when it is desired to search for a valley between the distribution B and the distribution C, in the case where the bit count value of the current read voltage V5 ranges from 8000 to 8499, the global shift amount $\Delta Vs1$ is specified as −0.5 V. In this case, the read voltage is shifted to V70=V5+$\Delta Vs1$=V5-0.5 V.

The memory controller 2 shifts the read voltage to V70 by the global shift amount $\Delta Vs1$ and performs a Vth tracking. The memory controller 2 alternately performs, a plurality of times, setting the read voltage through shifting by a new shift amount $\Delta Vs2$(<0) based on the shifted read voltage V70, and reading data at the set read voltage from the plurality of memory cells. In the following description, in order to distinguish the shift amount $\Delta Vs2$ from the global shift amount $\Delta Vs1$, the shift amount $\Delta Vs2$ used in the Vth tracking will be referred to as a local shift amount. An operation of shifting the read voltage by the local shift amount $\Delta Vs2$ in the Vth tracking will be referred to as a local shift operation.

Figure 8A:
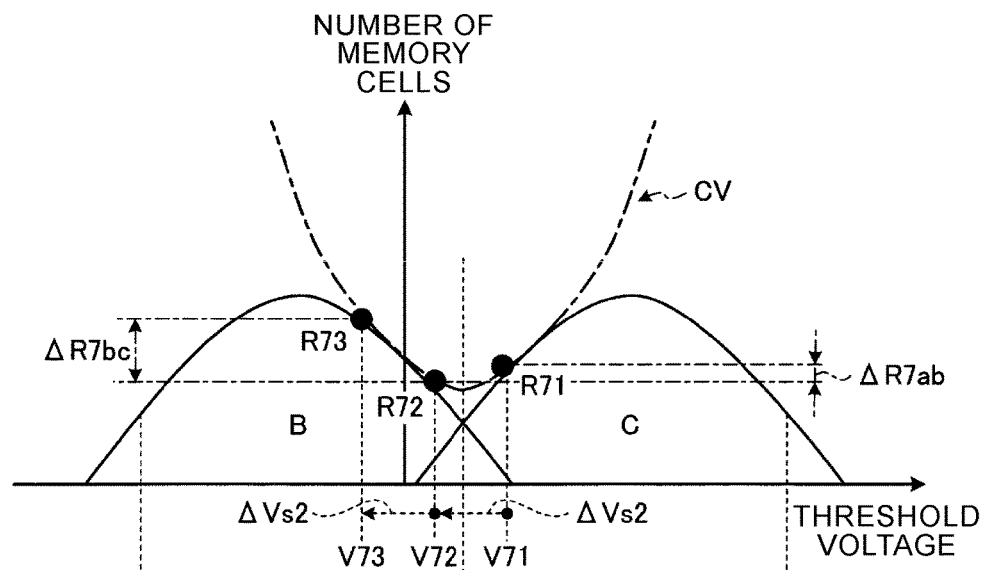
FIGS. 8A and 8B illustrate an example of threshold voltage tracking in the embodiment.
Figure 8B:
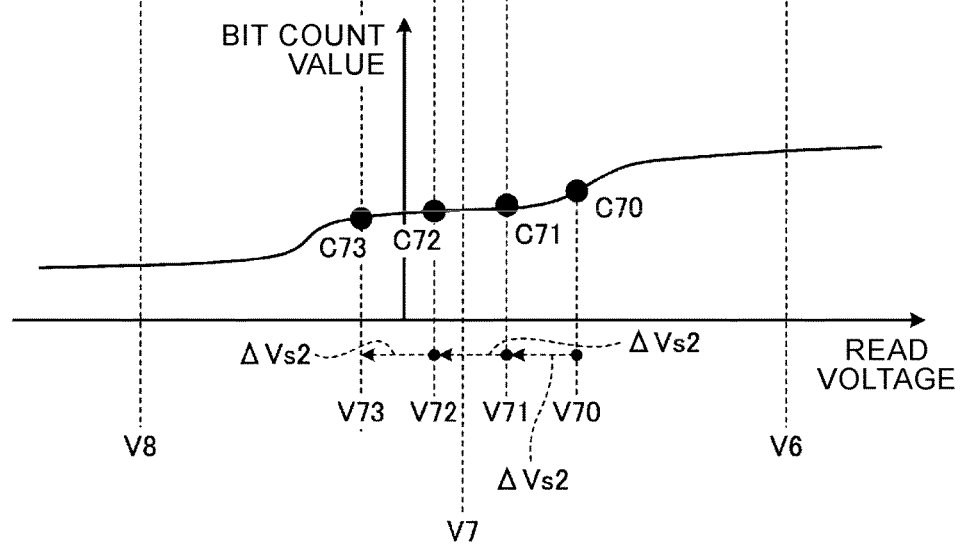

For example, the memory controller 2 performs a Vth tracking employing a local shift operation as illustrated in FIGS. 8A and 8B. FIGS. 8A and 8B are views illustrating a local shift operation. As illustrated in FIG. 8B, the memory controller 2 performs a read operation at the voltage V70 obtained through shifting by a global shift amount $\Delta Vs1$, and acquires a bit count value C70 at the voltage V70. The memory controller 2 performs a read operation at the voltage V71 (=V70+$\Delta Vs2$) obtained by shifting the voltage V70 by a local shift amount $\Delta Vs2$, and acquires a bit count value C71 at the voltage V71. The memory controller 2 performs a read operation at the voltage V72 (=V71+$\Delta Vs2$) obtained by shifting the voltage V71 by the local shift amount $\Delta Vs2$, and acquires a bit count value C72 at the voltage V72. The memory controller 2 performs a read operation at the voltage V73 (=V72+$\Delta Vs2$) obtained by shifting the voltage V72 by the local shift amount $\Delta Vs2$, and acquires a bit count value C73 at the voltage V73.

The memory controller 2 takes a difference between the bit count value C70 and the bit count value C71, and obtains the number R71 (=C70-C71) of memory cells at the threshold voltage V71. The memory controller 2 takes a difference between the bit count value C71 and the bit count value C72, and obtains the number R72 (=C71-C72) of memory cells at the threshold voltage V72. The memory controller 2 takes a difference between the bit count value C72 and the bit count value C73, and obtains the number R73 (=C72-C73) of memory cells at the threshold voltage V73.

As illustrated in FIG. 8A, the memory controller 2 plots a point (V71, R71), a point (V72, R72), and a point (V73, R73) on a virtual plane in which the horizontal axis indicates a threshold voltage, and the vertical axis indicates the number of memory cells. The memory controller 2 checks whether the number of memory cells at the intermediate point (V72, R72) among the three points is minimum. For example, the memory controller 2 compares $\Delta R7ab$=R71-R72 to $\Delta R7bc$=R72-R73. When $\Delta R7bc$<0<$\Delta R7ab$, it may be determined that among the three points, the number of memory cells at the intermediate point (V72, R72) is minimum (R72<R71, R72<R73). When determining that the number of memory cells at the intermediate point (V72, R72) is minimum among the three points, the memory controller 2 obtains a quadratic curve CV that approximately passes through the point (V71, R71), the point (V72, R72), and the point (V73, R73), as indicated by the one-dot chain line in FIG. 8A. Then, the memory controller 2 obtains a read voltage corresponding to a minimum value in the quadratic curve CV as a read voltage V7 of a desired valley.

Here, the memory controller 2 may obtain the minimum value itself in the quadratic curve CV, as the read voltage V7 of a desired valley, or may obtain the read voltage V7 of a desired valley by referring to the voltage information 222 and selecting a set (in this case, a set of the set number "k" illustrated in FIG. 5, k is an any integer larger than 1) in which the read voltage of the desired valley is closest to the minimal value (the minimum value) in the quadratic curve CV, among a plurality of sets stored in the voltage information 222.

When the intermediate point among the three points is not minimum, the memory controller 2 shifts the entire voltage range in which a local shift operation is required by $\Delta Vs3$. When the point at the low voltage side is minimum among the three points, $\Delta Vs3$ becomes a negative value, and the entire voltage range in which a local shift operation is required is shifted to the low voltage side. When the point at the high voltage side is minimum among the three points, $\Delta Vs3$ becomes a positive value, and the entire voltage range in which a local shift operation is required is shifted to the high voltage side.

Figure 9A:
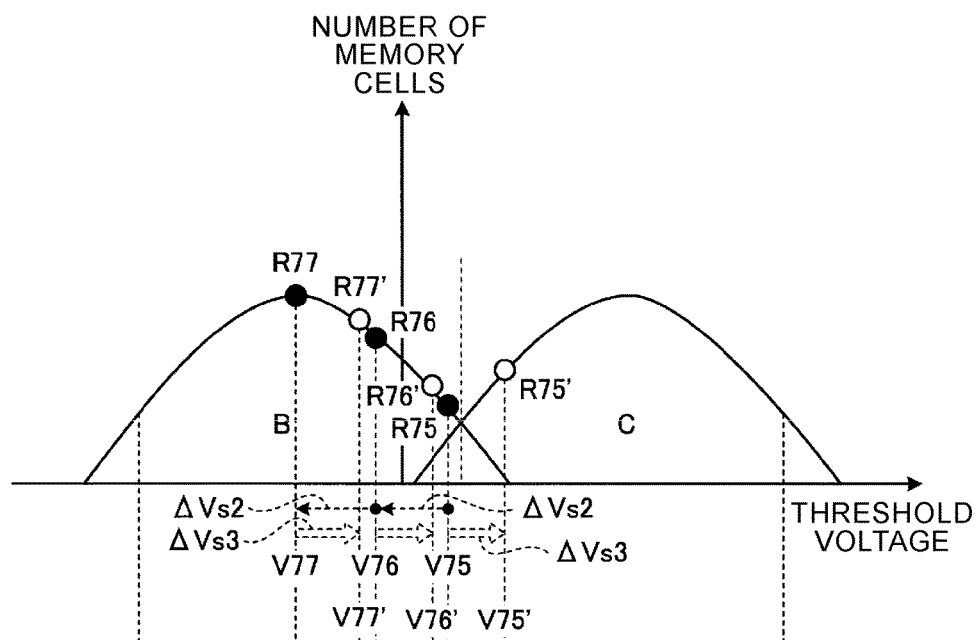
FIGS. 9A and 9B illustrate another example of threshold voltage tracking in the embodiment.
Figure 9B:
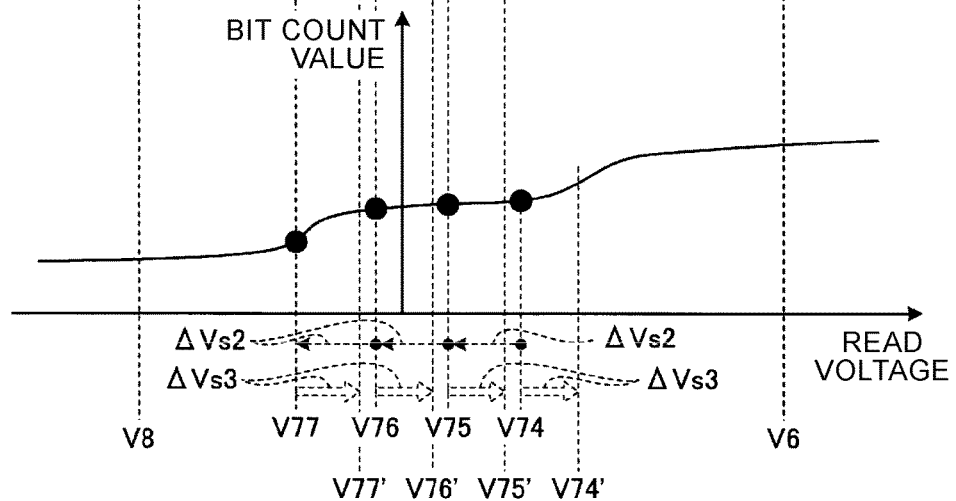

For example, as indicated by the black circles in FIG. 9A, among a point (V75, R75), a point (V76, R76), and a point (V77, R77), the number of memory cells at the point (V75, R75) at the high voltage side is the minimum, and so the memory controller 2 shifts the entire voltage range in which a local shift operation is required by $\Delta Vs3$ (>0). For example, when V74'=V74+$\Delta Vs3$=V70, the memory controller 2 performs a local shift operation in the same manner as in FIGS. 8A and 8B. That is, a read operation is sequentially performed at read voltages V74' (=V74+$\Delta Vs3$)=V70, V75' (=V75+$\Delta Vs3$)=V71, V76' (=V76+$\Delta Vs3$)=V72, and V77' (=V77+$\Delta Vs3$)=V73. Accordingly, as indicated by white circles in FIGS. 9A and 9B, three points (V75', R75'), (V76', R76'), and (V77', R77') at which the intermediate point becomes minimum may be obtained.

Figure 10:
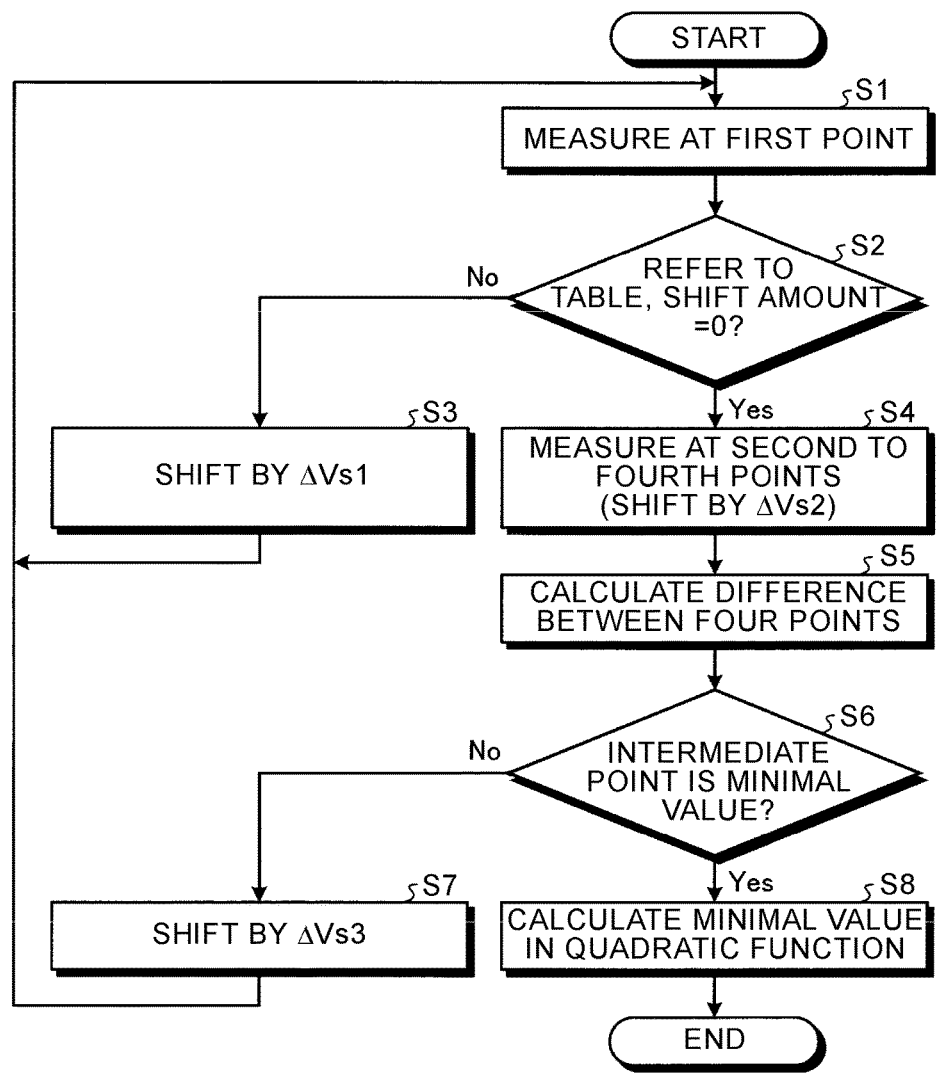
FIG. 10 is a flow chart illustrating an operation of the memory system according to the embodiment.

Subsequently, an operation (referred to herein as a re-try processing) of the memory system 100 will be described with reference to FIG. 10. FIG. 10 is a flowchart illustrating the operation of the memory system 100.

The memory system 100 measures a bit count value of a first point at a default read voltage for a valley as a searching target (S1). The memory system 100 determines whether a global shift amount is 0, with reference to the global shift information 221 (S2). When the global shift amount is not 0 ("No" in S2), the memory system 100 shifts the read voltage of the first point by a global shift amount ΔVs1 acquired from the table (S3), and measures a bit count value of the first point at the shifted read voltage (S1). When the global shift amount is 0 ("Yes" in S2), the memory system 100 determines that the read voltage is around the valley as the searching target, and measures bit count values of a second point to a fourth point while shifting the read voltage by a local shift amount ΔVs2 (S4). The memory system 100 calculates differences (three differences) between bit count values of the four points (S5), and plots three points corresponding to the three differences on a virtual plane in which a horizontal axis indicates a threshold voltage and a vertical axis indicates the number of memory cells. The memory system 100 compares the numbers of memory cells at the plotted three points to each other, and determines whether the number of memory cells at an intermediate point (which is a point at which the threshold voltage is an intermediate value) is a minimal value (S6). When the number of memory cells at the intermediate point is not a minimal value ("No" in S6), the memory system 100 shifts the entire voltage range in which a local shift operation is performed, by ΔVs3 (S7), and returns the process to S1. When the number of memory cells at the intermediate point is a minimal value ("Yes" in S6), the memory system 100 obtains a quadratic curve approximately passing through the plotted three points, and obtains a read voltage corresponding to a minimal value of the quadratic curve as a read voltage of a desired valley (S8).

As described above, in the memory system. 100, as a re-try processing, it is detected whether or not a threshold voltage distribution of memory cells deviates by a large amount, and a read voltage is shifted according to the detection result, and a Vth tracking is performed based on the shifted voltage. For example, a bit count value of a first point at a default read voltage for a valley as a searching target may be measured, a global shift amount according to the bit count value may be obtained with reference to the global shift information 221, a read voltage used for measuring the first point may be shifted by the global shift amount. Accordingly, when the threshold voltage distribution of memory cells deviates by a large amount, it is possible to search for a position of a valley in a short time without erroneously detecting adjacent valleys. Accordingly, erroneous detection in the Vth tracking may be reduced.

In the memory system 100, when the Vth tracking is performed, in the case where an intermediate point is not a minimal value, a re-try processing is performed by shifting a read voltage by a predetermined amount. Accordingly, the detection accuracy of the Vth tracking may be improved.

In the memory system 100, the measurement of a bit count value in the Vth tracking is performed from the high voltage side. Accordingly, for example, the Vth tracking may be properly performed according to the fact that the peak of a distribution Er tends to collapse.

When reading is possible, the voltage value in the table may be stored, and then, at the time of a read operation according to the next re-try request (at the time of the read operation in the next re-try processing), reading may be performed at the stored voltage value. For example, in the example illustrated in FIGS. 8A and 8B, since a read voltage of the valley between the distribution B and the distribution C is obtained as V7, when a read operation at the read voltage V7 is successful, the set number of the read voltage to be used at the time of the read operation in the next re-try processing is stored as a set number "k" as illustrated in FIG. 5. Then, the memory controller 2 uses the read voltage of the set number "k" in the voltage information 222 at the time of the read operation in the next re-try processing. Accordingly, when the valley between the distribution B and the distribution C is read at the time of the read operation in the next re-try processing, V7 may be used as a read voltage. Therefore, it is possible to reduce the frequency of global shifts, and to shorten a time required for a re-try processing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory including a plurality of memory cells; and
   a controller configured to perform a read re-try in response to a failed normal read, wherein the read re-try includes
   a first read processing of reading data from the plurality of memory cells at a first read voltage,
   a second read processing of reading data from the plurality of memory cells at a second read voltage obtained by shifting the first read voltage by a first shift amount, which is determined according to a bit count value obtained by counting a number of predetermined bit values in the data read in the first read processing,
   a third read processing of reading data from the plurality of memory cells a plurality of times at a plurality of third read voltages and obtaining a bit count value for each of the third read voltages, wherein each of the plurality of third read voltages are shifted from each other by a second shift amount, and
   a final read processing of reading data from the plurality of memory cells at a read voltage that is set closer to the second read voltage than the first read voltage.

2. The memory system according to claim 1, wherein the controller specifies the first shift amount corresponding to the bit count value obtained through the counting, by referring to stored information in which a plurality of shift amounts is associated with a plurality of bit count values.

3. The memory system according to claim 1, wherein the read re-try further includes:
   a first calculation processing of obtaining a difference values of bit count values corresponding to each of the third read voltages; and
   a second calculation processing of obtaining a read voltage corresponding to a minimum value of a quadratic function approximated from the third read voltages and the corresponding difference values.

4. The memory system according to claim 3, wherein the final read processing is carried out using the read voltage obtained through the second calculation processing.

5. The memory system according to claim 3, wherein the final read processing is carried out using a read voltage that is correlated to the read voltage obtained through the second calculation processing.

6. The memory system according to claim 1, wherein the read re-try further includes:
    a first calculation processing of obtaining a difference values of bit count values corresponding to each of the third read voltages and a third read voltage with a minimum difference value,
    a change processing of shifting the third read voltages by a third shift amount if the third read voltage with the minimum difference value is the smallest or largest among the plurality of third read voltages, and
    a fourth read processing of reading data from the plurality of memory cells a plurality of times at a plurality of fourth read voltages, wherein each of the plurality of fourth read voltages is shifted from a corresponding one of the third read voltages by the third shift amount,
    wherein the read voltage of the final read processing is between the smallest of the fourth read voltages and the largest of the fourth read voltages.

7. The memory system according to claim 6, wherein the third shift amount is set to shift the third read voltages to a low voltage side when the smallest of the third read voltages has the minimum difference.

8. The memory system according to claim 6, wherein the third shift amount is set to shift the third read voltages to a high voltage side when the largest of the third read voltages has the minimum difference.

9. The memory system according to claim 1, wherein
    the controller is configured to store the read voltage of the final read processing in a management information storage area of the non-volatile memory, and
    during the first read processing of a subsequent read re-try request, the controller selects the stored read voltage as the first voltage.

10. The memory system according to claim 1, wherein each of the plurality of memory cells is capable of storing multiple bits of data.

11. A method of performing a read re-try in response to a failed normal read in a memory system including a non-volatile memory including a plurality of memory cells, said method comprising:
    a first read processing of reading data from the plurality of memory cells at a first read voltage;
    a second read processing of reading data from the plurality of memory cells at a second read voltage obtained by shifting the first read voltage by a first shift amount, which is determined according to a bit count value obtained by counting a number of predetermined bit values in the data read in the first read processing;
    a third read processing of reading data from the plurality of memory cells a plurality of times at a plurality of third read voltages and obtaining a bit count value for each of the third read voltages, wherein each of the plurality of third read voltages are shifted from each other by a second shift amount; and
    a final read processing of reading data from the plurality of memory cells at a read voltage that is set closer to the second read voltage than the first read voltage.

12. The method according to claim 11, wherein the second read processing includes:
    determining the first shift amount corresponding to the bit count value obtained through the counting, by referring to stored information in which a plurality of shift amounts is associated with a plurality of bit count values.

13. The method according to claim 11, further comprising:
    a first calculation processing of obtaining a difference values of bit count values corresponding to each of the third read voltages; and
    a second calculation processing of obtaining a read voltage corresponding to a minimum value of a quadratic function approximated from the third read voltages and the corresponding difference values.

14. The method according to claim 13, wherein the final read processing is carried out using the read voltage obtained through the second calculation processing.

15. The method according to claim 13, wherein the final read processing is carried out using a read voltage that is correlated to the read voltage obtained through the second calculation processing.

16. The method according to claim 11, further comprising:
    a first calculation processing of obtaining a difference values of bit count values corresponding to each of the third read voltages and a third read voltage with a minimum difference value;
    a change processing of shifting the third read voltages by a third shift amount if the third read voltage with the minimum difference value is the smallest or largest among the plurality of third read voltages; and
    a fourth read processing of reading data from the plurality of memory cells a plurality of times at a plurality of fourth read voltages, wherein each of the plurality of fourth read voltages is shifted from a corresponding one of the third read voltages by the third shift amount,
    wherein the read voltage of the final read processing is between the smallest of the fourth read voltages and the largest of the fourth read voltages.

17. The method according to claim 16, wherein the third shift amount is set to shift the third read voltages to a low voltage side when the smallest of the third read voltages has the minimum difference.

18. The method according to claim 16, wherein the third shift amount is set to shift the third read voltages to a high voltage side when the largest of the third read voltages has the minimum difference.

19. The method according to claim 11, further comprising:
    storing the read voltage of the final read processing in a management information storage area of the non-volatile memory; and
    during the first read processing of a subsequent read re-try request, selecting the stored read voltage as the first voltage.

20. The method according to claim 11, wherein each of the plurality of memory cells is capable of storing multiple bits of data.

* * * * *